United States Patent
Kang et al.

(10) Patent No.: US 7,959,738 B2
(45) Date of Patent: Jun. 14, 2011

(54) METHOD OF REMOVING PHOTORESIST AND METHOD OF MANUFACTURING A SEMICONDUCTOR DEVICE

(75) Inventors: Dae-Hyuk Kang, Hwaseong-si (KR); Hyo-San Lee, Suwon-si (KR); Dong-Gyun Han, Yongin-si (KR); Chang-Ki Hong, Seongnam-si (KR); Kun-Tack Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 679 days.

(21) Appl. No.: 11/984,340

(22) Filed: Nov. 16, 2007

(65) Prior Publication Data
US 2008/0138972 A1   Jun. 12, 2008

(30) Foreign Application Priority Data

Nov. 16, 2006   (KR) .................. 10-2006-0113093

(51) Int. Cl.
*H01L 21/28* (2006.01)
(52) U.S. Cl. .................. 134/1.3; 510/175; 438/595
(58) Field of Classification Search .............. 134/1.3; 510/175; 438/595
See application file for complete search history.

(56) References Cited

U.S. PATENT DOCUMENTS

| | | | |
|---|---|---|---|
| 6,509,141 B2 | 1/2003 | Mullee | |
| 6,683,008 B1* | 1/2004 | Cotte et al. | 438/745 |
| 7,431,855 B2* | 10/2008 | Han et al. | 216/57 |
| 2003/0027085 A1* | 2/2003 | Mullee | 430/329 |
| 2004/0011386 A1* | 1/2004 | Seghal | 134/26 |
| 2004/0050406 A1* | 3/2004 | Sehgal | 134/26 |
| 2004/0266205 A1 | 12/2004 | Han et al. | |
| 2006/0040840 A1* | 2/2006 | Korzenski et al. | 510/175 |

FOREIGN PATENT DOCUMENTS

| | | |
|---|---|---|
| KR | 2002-0047327 | 6/2002 |
| KR | 0597656 | 6/2006 |
| KR | 102007007451 | 7/2007 |

OTHER PUBLICATIONS

Korean Office Action dated Sep. 20, 2007.

* cited by examiner

*Primary Examiner* — Gregory E Webb
(74) *Attorney, Agent, or Firm* — Harness, Dickey & Pierce, P.L.C.

(57) ABSTRACT

A method of removing a photoresist may include permeating supercritical carbon dioxide into the photoresist on a substrate having a conductive structure including a metal. The photoresist permeating the supercritical carbon dioxide may be easily removable. The photoresist permeating the supercritical carbon dioxide may be removed using a photoresist cleaning solution from the substrate. The photoresist cleaning solution may include an alkanolamine solution of about 8 percent by weight to about 20 percent by weight, a polar organic solution of about 25 percent by weight to about 40 percent by weight, a reducing agent of about 0.5 percent by weight to about 3 percent by weight with the remainder being water. The photoresist may be easily removed without damaging the conductive structure in a plasma process.

19 Claims, 5 Drawing Sheets

METHOD OF REMOVING PHOTORESIST AND METHOD OF MANUFACTURING A SEMICONDUCTOR DEVICE

PRIORITY STATEMENT

This application claims priority under 35 U.S.C. §119 to Korean Patent Application No. 2006-113093, filed on Nov. 16, 2006, in the Korean Intellectual Property Office (KIPO), the entire contents of which are herein incorporated by reference.

BACKGROUND

1. Field

Example embodiments relate to a method of removing photoresist and a method of manufacturing a semiconductor device. More particularly, example embodiments relate to a method of removing photoresist exposed to an ion implantation process and a method of manufacturing a semiconductor device.

2. Description of the Related Art

Several photoresist patterns may be formed on a substrate and removed from the substrate in a process for manufacturing a semiconductor device. A photoresist pattern may serve as an etching mask in an etching process or an ion implantation mask in an ion implantation process. The photoresist pattern may be removed from the substrate by a dry cleaning process, e.g., an ashing process using oxygen ($O_2$) plasma, and/or a wet cleaning process using an organic stripper. When the photoresist pattern is removed from the substrate by the ashing process using the oxygen plasma, the substrate and/or an understructure may be damaged by the plasma so that the semiconductor device may have deteriorated electrical characteristics and reliability.

When the underlying structure includes metal, the understructure may be damaged during the ashing process using the plasma. The electrical characteristics of the semiconductor device may also be deteriorated. Additionally, when the photoresist pattern is removed using the organic stripper, the process for removing the photoresist pattern may cause various problems, e.g., increased costs due to an organic material, the possibility of accidents due to an increased temperature process, the generation of unnecessary particles, an equipment management burden, drying difficulties, incidental expenses for treating a waste organic stripper and/or environmental problems.

To completely remove an organic residue on the substrate, the organic residue may be cleaned by an ashing process using plasma. Harmful cleaning chemicals, e.g., hydrogen fluoride and/or sulfuric acid, may be used to clean the organic residue at an increased temperature after the ashing process. When a conductive layer pattern including metal is exposed during the removal of the organic residue, the exposed conductive layer pattern may be eroded or undesirably etched by the cleaning chemicals.

Considering the above-mentioned problems, the conventional art discloses a method of removing a photoresist or an organic residue using supercritical carbon dioxide. However, the photoresist may not be effectively removed from a substrate by the method suggested by the conventional art because the supercritical carbon dioxide and a cleaning solution are simultaneously provided onto the substrate so that the photoresist is removed from the substrate. Additionally, solutions and/or additives applied to remove the photoresist may remain on the substrate so that residues serving as contamination sources may be generated on the substrate. A conductive structure including metal may be damaged in the process for removing the photoresist.

The conventional art discloses a method of removing a photoresist pattern using ozone gas and water steam. However, according to the method disclosed in the conventional art and as illustrated in FIG. 1, a photoresist pattern 30 may not be completely removed because the photoresist pattern 30 exposed to an ion implantation process may include a deteriorated portion 20 and a non-deteriorated portion 15. For example, the deteriorated portion 20 of the photoresist pattern 30 may not be easily removed from a substrate by the method.

SUMMARY

Example embodiments provide a method of removing a photoresist without damage to a conductive structure. Example embodiments provide a method of manufacturing a semiconductor device without damage to a conductive structure by employing the method of removing the photoresist.

According to example embodiments, there is provided a method of removing a photoresist. In the method of removing a photoresist, supercritical carbon dioxide may be permeated into the photoresist formed on a substrate having a conductive structure including a metal. The photoresist may be removed from the substrate using a cleaning solution without damage to the conductive structure.

In example embodiments, the photoresist may include at least one of a photoresist pattern serving as an ion implantation mask, a photoresist pattern serving as an etching mask and a photoresist residue on the substrate. In example embodiments, the photoresist may include an external portion deteriorated by ions in an ion implantation process. An internal portion of the photoresist may not be deteriorated by the ions. In example embodiments, the photoresist may be exposed to an ion implantation process performed with a dose of about $1\times10^{11}$ atoms/cm$^2$ to about $1\times10^{17}$ atoms/cm$^2$.

In example embodiments, the supercritical carbon dioxide may be permeated into the photoresist without a mixed solvent including an alcoholic solvent and an amino solvent. For example, the supercritical carbon dioxide may be permeated at a temperature of about 40° C. to about 100° C. and a pressure of about 1,000 psi to about 3,500 psi.

In example embodiments, the supercritical carbon dioxide may be permeated into the photoresist with a mixed solvent including an alcoholic solvent and an amino solvent. An amount of the mixed solvent may be in a range of about 0.1 to about 10 percent by weight of an amount of the supercritical carbon dioxide. In example embodiments, the cleaning solution may include about 8 to about 20 percent by weight of an alkanolamine solution, about 25 to about 40 percent by weight of a polar organic solution, about 0.5 to about 3 percent by weight of a reducing agent with the remainder being water.

According to example embodiments, there is provided a method of manufacturing a semiconductor device. In the method of manufacturing a semiconductor device, a substrate having photoresist and a conductive structure may be prepared. The photoresist may be exposed to an ion implantation process. The conductive structure may include metal. Supercritical carbon dioxide may be permeated into the photoresist to expand the photoresist and to break polymer bonds in the photoresist. The photoresist may be removed from the substrate using a cleaning solution including about 8 to about 20 percent by weight of an alkanolamine solution, about 25 to about 40 percent by weight of a polar organic solution, about 0.5 to about 3 percent by weight of a reducing agent with the remainder being water.

In example embodiments, impurities may be implanted into portions of the substrate adjacent to the conductive structure with a dose of about $1\times10^{11}$ atoms/cm$^2$ to about $1\times10^{17}$ atoms/cm$^2$ before providing the substrate. In example embodiments, the photoresist may include an external portion deteriorated by ions in the ion implantation process. In example embodiments, the conductive structure may include a gate structure having a tungsten film pattern and a polysilicon film pattern.

According to example embodiments, a photoresist pattern or a photoresist film exposed to an ion implantation process may be effectively removed from a substrate because the photoresist pattern or the photoresist film is removed using supercritical carbon dioxide and a cleaning solution having a properly adjusted composition. For example, the supercritical carbon dioxide may be permeated into the photoresist pattern or the photoresist film, and then the cleaning solution may be applied to the photoresist pattern or the photoresist film, thereby effectively removing the photoresist pattern or the photoresist film without damage to a conductive structure formed on the substrate.

When a semiconductor device is manufactured using the process for removing the photoresist pattern or the photoresist film, the semiconductor device may have enhanced electrical characteristics and reliability. Any harmful cleaning solution, e.g., a sulfuric acid solution, may not need to be employed in a process for removing the photoresist pattern or the photoresist film and also any plasma ashing process may not need to be applied to remove the photoresist pattern or the photoresist film.

BRIEF DESCRIPTION OF THE DRAWINGS

Example embodiments will be more clearly understood from the following detailed description taken in conjunction with the accompanying drawings.

FIG. 1 is a scanning electron microscope (SEM) image showing a conventional photoresist pattern exposed to an ion implantation process;

FIG. 2 is a flow chart illustrating a method of removing a photoresist in accordance with example embodiments;

FIGS. 3 to 6 are cross-sectional views illustrating a method of manufacturing a semiconductor device in accordance with example embodiments;

FIG. 7 is an SEM image illustrating a photoresist film according to Example 1;

FIG. 8 is an SEM image illustrating a substrate from which a photoresist film is effectively removed according to Example 2; and FIG. 9 is an SEM image illustrating a substrate from which a photoresist film is removed according to the Comparative Example.

Figure 1:
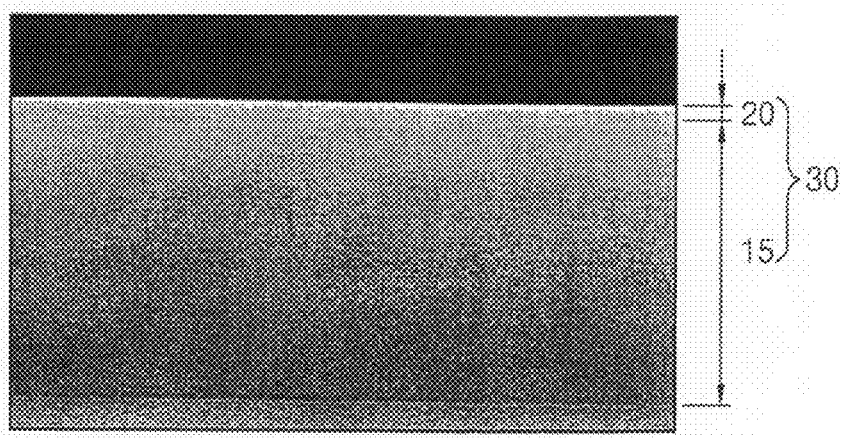
FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments are described more fully hereinafter with reference to the accompanying drawings, in which example embodiments are shown. Example embodiments may, however, be embodied in many different forms and should not be construed as limited to the example embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
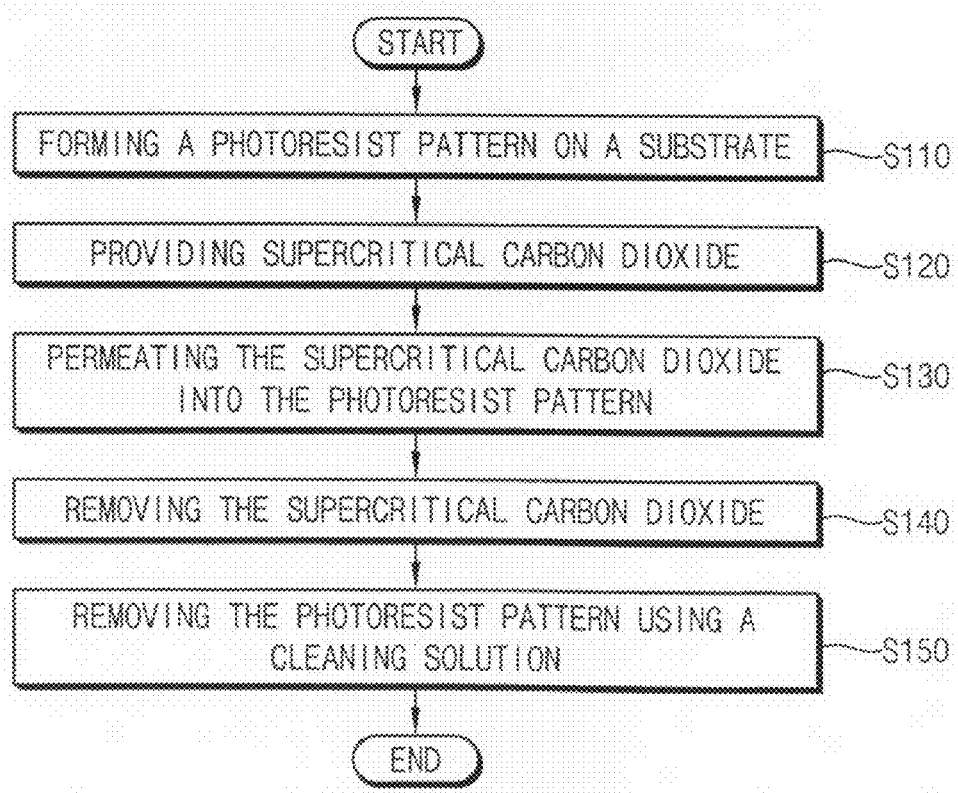

FIG. 2 is a flow chart illustrating a method of removing a photoresist pattern in accordance with example embodiments. Referring to FIG. 2, a photoresist pattern may be formed on a substrate in S110. The substrate may additionally include a conductive structure. The conductive structure may be formed using a metal layer pattern, a metal oxide layer pattern, a metal nitride layer pattern, a polysilicon layer pattern, a gate structure and/or a bit line. The metal layer pattern may include tungsten (W), aluminum (Al), titanium (Ti), tantalum (Ta) and/or copper (Cu). The metal oxide layer pattern may be formed using tungsten nitride, titanium nitride, aluminum nitride and/or tantalum nitride.

The photoresist pattern may serve as an etching mask to form the conductive structure by a reactive ion etching (RIE) process, an ion beam etching (IBE) process, a plasma etching process and/or a laser etching process. Alternatively, the photoresist pattern may serve as an ion implantation mask in an ion implantation process. Further, the photoresist pattern may correspond to a photoresist residue remaining on a sidewall of an opening or on the substrate. The photoresist pattern may serve as a sacrificial layer to form a lower electrode of a capacitor. When the photoresist pattern serves as the sacrificial layer, the photoresist pattern may cover the lower electrode of a conductive material having a cylindrical shape.

In example embodiments, the photoresist pattern may include photoresist for an I-line laser with a wavelength of about 365 nm, photoresist for a krypton fluoride (KrF) laser with a wavelength of about 248 nm, photoresist for an argon fluoride (ArF) laser with a wavelength of about 193 nm and/or photoresist for a fluorine ($F_2$) laser with a wavelength of about 157 nm. When the photoresist pattern includes the photoresist for the ArF laser, the photoresist pattern may include an acrylic resin or a methacrylate resin including single bonds of carbon.

When the photoresist pattern serves as the etching mask or the ion implantation mask, the photoresist pattern may include an external portion and an internal portion. The external portion of the photoresist pattern may be deteriorated by an etchant or ions, whereas the internal portion of the photoresist pattern may maintain quality after an etching process or an ion implantation process.

In example embodiments, the external portion of the photoresist pattern may include coupled polymers after the photoresist pattern is exposed to the ion implantation process performed with a dose of about $1 \times 10^{11}$ atoms/cm$^2$ to about $1 \times 10^{17}$ atoms/cm$^2$. For example, the polymers in the external portion of the photoresist pattern may be three-dimensionally cross-linked after the ion implantation process. This external portion of the photoresist pattern may not be completely removed using a conventional organic cleaning solution for removing photoresist. Further, the conductive structure provided on the substrate may be damaged in removing the photoresist pattern having the external portion including the cross-linked polymers.

Referring now to FIG. 2, supercritical carbon dioxide may be provided onto the substrate having the photoresist pattern in S120. In example embodiments, the supercritical carbon dioxide may be generated by providing carbon dioxide in a chamber that has a critical temperature of about 40° C. to about 100° C. and a critical pressure of about 1,000 psi to about 3,500 psi. For example, the critical temperature may be in a range of about 50° C. to about 90° C. and the critical pressure may be in a range of about 1,200 psi to about 3,000 psi. This supercritical carbon dioxide may be provided onto the photoresist pattern on the substrate. In example embodiments, generating the supercritical carbon dioxide and providing the supercritical carbon dioxide may be carried out in situ.

In S130, the supercritical carbon dioxide may be permeated into the photoresist pattern formed on the substrate. The polymers in the photoresist pattern may be expanded by the permeated supercritical carbon dioxide and also the three-dimensionally cross-linked polymers may be broken by the permeated supercritical carbon dioxide. The supercritical carbon dioxide may be more easily permeated into the hardened external portion of the photoresist pattern because the supercritical carbon dioxide may have a faster diffusion speed, such as that of a gas, and a higher solubility caused by a relatively high density, such as that of a liquid. In example embodiments, the supercritical carbon dioxide may be permeated into the photoresist pattern without a mixed solvent including an alcoholic solvent and an amino solvent. Alternatively, the supercritical carbon dioxide may be permeated into the photoresist pattern with a mixed solvent including an alcoholic solvent and an amino solvent.

Examples of the alcoholic solvent in the mixed solvent may include ethylene glycol, ethanol, methanol and/or propanol. Examples of the amino solvent in the mixed solvent may include dimethylacetamide, dimethylsulfoxide and/or N-methyl-2-pyrrolidone. An amount of the mixed solvent may be in a range of about 0.1 to about 10 percent by weight based on an amount of the supercritical carbon dioxide. For example, an amount of the mixed solvent may be about 0.5 to about 5 percent by weight relative to an amount of the supercritical carbon dioxide. In example embodiments, the mixed solvent may additionally include water.

In S140, the supercritical carbon dioxide may be removed from the substrate. For example, the supercritical carbon dioxide in the chamber may be exhausted from the chamber, and the pressure of the chamber may be simultaneously reduced below the critical pressure. The supercritical carbon dioxide may be transformed into gaseous carbon dioxide in the chamber, and thus the supercritical carbon dioxide may be removed from the substrate. With treating the supercritical carbon dioxide, the external portion of the photoresist pattern may be expanded and cracks may be generated in the external portion of the photoresist pattern by breaking the cross-linked polymers. The external portion of the photoresist pattern may be more easily dissolved a cleaning solution for removing the photoresist pattern.

In S150, the photoresist pattern treated with the supercritical carbon dioxide may be removed from the substrate. The photoresist pattern may be removed using the cleaning solution. The cleaning solution may prevent or reduce erosion of the conductive structure and/or damage to the conductive structure. In example embodiments, the cleaning solution may include about 5 to about 25 percent by weight of an alkanolamine solution, about 20 to about 50 percent by weight of a polar organic solvent, about 0.1 to about 5 percent by weight of a reducing agent with the remainder being water.

When the cleaning solution includes below about 5 percent by weight of the alkanolamine solution, the photoresist pattern may not be effectively removed from the substrate. On the other hand, the conductive structure may be damaged or eroded by the cleaning solution when the cleaning solution includes more than about 25 percent by weight of the alkanolamine solution. Therefore, the cleaning solution may include about 5 to about 25 percent by weight of the alkanolamine solution. For example, the cleaning solution may include about 10 percent by weight to about 20 percent by weight of the alkanolamine solution. Examples of the alkanolamine solution may include monoethanolamine (MEA) and/or monoisopropanolamine. These may be used alone or in a mixture thereof.

When the cleaning solution includes below about 20 percent by weight of the polar organic solvent, the photoresist pattern may not be efficiently removed from the substrate. However, the conductive structure may be eroded or damaged by the cleaning solution when the cleaning solution includes more than about 50 percent by weight of the polar organic solvent. The cleaning solution may include about 20 percent by weight to about 50 percent by weight, of the polar organic solvent. For example, the cleaning solution may include about 25 percent by weight to about 40 percent by weight of the polar organic solvent. Examples of the polar organic solvent may include dimethylacetamide, dimethylamide, N-methyl-2-pyrrolidone, dimethylsulfoxide, ethyleneglycolmonomethylether, ethyleneglycolmonoethylether, propyleneglycolmethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether and/or ethyl lactate. These may be used alone or in a composition thereof.

In example embodiments, the cleaning solution may include about 0.1 percent by weight to about 5.0 percent by weight of the reducing agent. For example, the cleaning solution may include about 0.5 percent by weight to about 3.0 percent by weight of the reducing agent. Examples of the reducing agent may include thioglycol acid, ascorbic acid, glutathione, N-acetyl cysteine and/or N-acetyl methionine. The cleaning solution may be permeated into the photoresist pattern treated using the supercritical carbon dioxide to thereby dissolve the photoresist pattern without any damage to the conductive structure. The photoresist pattern may be completely removed from the substrate by the cleaning solution.

In example embodiments, a rinsing process may be performed on the substrate using pure water after removing the photoresist pattern. In the rinsing process, a photoresist residue and a remaining cleaning solution may be removed from the substrate using pure water. The rinsing process may be executed by immersing the substrate into a cleaning bath containing pure water. Alternatively, the rinsing process may be performed by spraying pure water onto the substrate while revolving the substrate. In example embodiments, a drying process may be performed on the substrate after the rinsing process. The drying process may be carried out using isopropyl alcohol (IPA) steam.

According to example embodiments, a photoresist pattern may be more easily removed from a substrate using supercritical carbon dioxide and a cleaning solution having a desired composition without a plasma ashing process and/or a cleaning process using ozone. Additionally, the photoresist pattern may be effectively removed from the substrate without damage to a conductive structure and the substrate. Therefore, a semiconductor device may have enhanced electrical characteristics and the manufacturing throughput of the semiconductor device may be improved.

Figure 3:
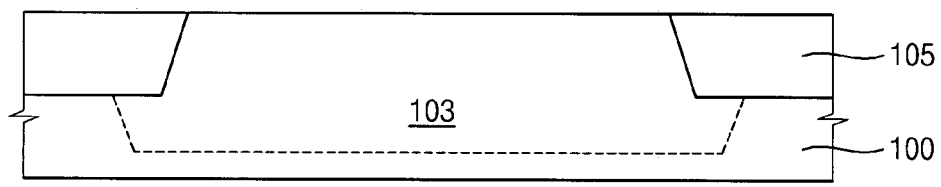

FIGS. 3 to 6 are cross-sectional views illustrating a method of manufacturing a semiconductor device in accordance with example embodiments. Referring to FIG. 3, after a first photoresist pattern (not illustrated) is formed on a substrate 100, p-type impurities or n-type impurities may be doped into the substrate 100 using the first photoresist pattern as an ion implantation mask. A wall 103 having a p-type or an n-type may be formed at the substrate 100. In the ion implantation process, an external portion of the first photoresist pattern may be exposed to ions so that the external portion of the first photoresist pattern may be hardened. For example, a hardened portion of the first photoresist pattern may be generated after the ion implantation process. The hardened portion of the first photoresist pattern may include three-dimensionally cross-linked polymers that have been cross-linked by the ions.

To remove the first photoresist pattern from the substrate 100, supercritical carbon dioxide may be permeated into the first photoresist pattern having the hardened portion, and then, a cleaning process may be performed on the first photoresist pattern using a cleaning solution. For example, the cleaning solution may include about 5 to about 25 percent by weight of an alkanolamine solution, about 20 to 50 percent by weight of a polar organic solvent, about 0.1 to about 5 percent by weight of a reducing agent with the remainder being water. When the first photoresist pattern is removed using the supercritical carbon dioxide and the cleaning solution, the first photoresist pattern may be completely removed from the substrate 100. The processes for removing the first photoresist pattern using the supercritical carbon dioxide and the cleaning solution may be substantially the same as or similar to those described with reference to FIG. 2.

An isolation layer 105 may be formed on the substrate 100 by an isolation process, e.g., a shallow trench isolation (STI) process, after removing the first photoresist pattern. When the isolation layer 105 is formed on the substrate 100, the substrate 100 may be divided into an active region and a field region.

Figure 4:
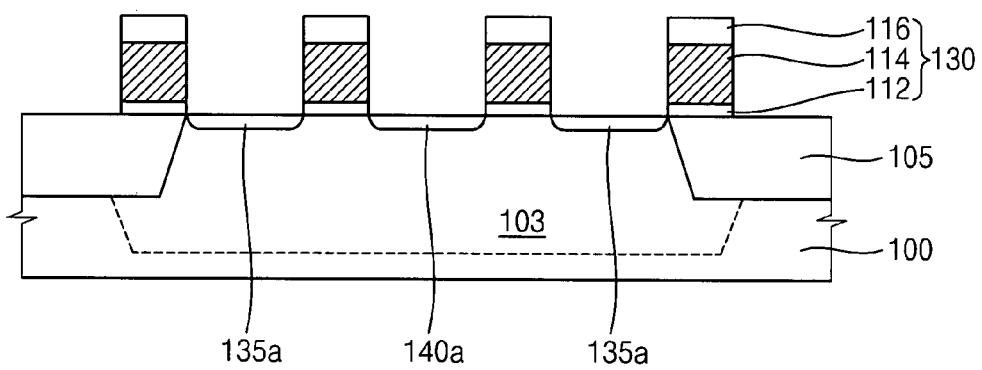

Referring to FIG. 4, a gate insulation layer (not illustrated) may be formed on the substrate 100 having the isolation layer 105. The gate insulation layer may be formed using silicon oxide or a material having a dielectric constant higher than that of silicon oxide. Examples of the material in the gate insulation layer may include hafnium oxide ($HfO_x$), zirconium oxide ($ZrO_x$), tantalum oxide ($TaO_x$), yttrium oxide ($YO_x$), niobium oxide ($NbO_x$), aluminum oxide ($AlO_x$), titanium oxide ($TiO_x$), cerium oxide ($CeO_x$), indium oxide ($InO_x$), ruthenium oxide ($RuO_x$), magnesium oxide (MgO), strontium oxide (SrO), boron oxide ($BO_x$), tin oxide ($SnO_x$), lead oxide ($PbO_x$), vanadium oxide ($VO_x$), lanthanum oxide (LaO$_X$), praseodymium oxide (PrO$_X$), antimony oxide (SbO$_X$) and/or calcium oxide (CaO). These may be used alone or in a mixture thereof.

A gate electrode layer (not illustrated), a hard mask layer (not illustrated) and a second photoresist pattern (not illustrated) may be successively formed on the gate insulation layer. The gate electrode layer may include a polysilicon film and a conductive film. The gate electrode layer may be patterned to form a gate electrode 114. The conductive film may be formed using a metal, e.g., tungsten, or a metal compound, e.g., tungsten silicide and/or titanium nitride. In example embodiments, the gate electrode layer may include a polysilicon film, a first tungsten silicide film, a titanium nitride film, a second tungsten silicide film and a tungsten film.

The hard mask layer may be patterned to form a hard mask 116 on the gate electrode 114. The hard mask layer may be formed using a material having an etching selectivity relative to an insulating interlayer 145 (see FIG. 6) successively formed. For example, the hard mask layer may be formed using a nitride, e.g., silicon nitride, when the insulating interlayer 145 includes an oxide, e.g., silicon oxide.

Using the second photoresist pattern as an etching mask, the hard mask 116 may be partially etched to form the hard mask 116. The hard mask 116 may be formed by a dry etching process, e.g., an RIE process, an IBE process, a plasma etching process and/or a laser etching process. The gate electrode layer and the gate insulation layer may be patterned using the hard mask 116 as an etching mask. A gate structure 130 may be formed on the substrate 100. The gate structure 130 may include a gate insulation layer pattern 112, the gate electrode 114 and the hard mask 116.

Impurities may be implanted into portions of the substrate 100 adjacent to the gate structure 130 using the gate structure 130 as an ion implantation mask. The substrate 100 may be thermally treated to form a first contact region 135$a$ and a second contact region 140$a$. The first and the second contact regions 135$a$ and 140$a$ may correspond to a preliminary source region and a preliminary drain region, respectively. In example embodiments, the preliminary source and the preliminary drain regions may be formed by doping the impurities into the substrate 100 with a dose of about $1\times10^{11}$ atoms/cm$^2$ to about $1\times10^{17}$ atoms/cm$^2$.

When the substrate 100 includes a p-type metal-oxide semiconductor (PMOS) area and an n-type metal-oxide semiconductor (PMOS) area, an additional ion implantation process may be performed to form the preliminary source and the preliminary drain regions after a third photoresist pattern (not illustrated) serving as an ion implantation mask is formed on the substrate 100. After the additional ion implantation process, the third photoresist pattern may include an internal portion and an external portion deteriorated by ions. The external portion of the third photoresist pattern may include three-dimensionally cross-linked polymers that have been cross-linked by the ions. To remove the third photoresist pattern without damage to the gate electrode 114, supercritical carbon dioxide may be permeated into the third photoresist pattern, and then, a cleaning process may be performed on the third photoresist pattern. The third photoresist pattern may be completely removed from the substrate 100 without any damage to the gate structure 130. The processes of removing the third photoresist pattern using the supercritical carbon dioxide and a cleaning solution may be substantially the same as or similar to those described with reference to FIG. 2.

Figure 5:
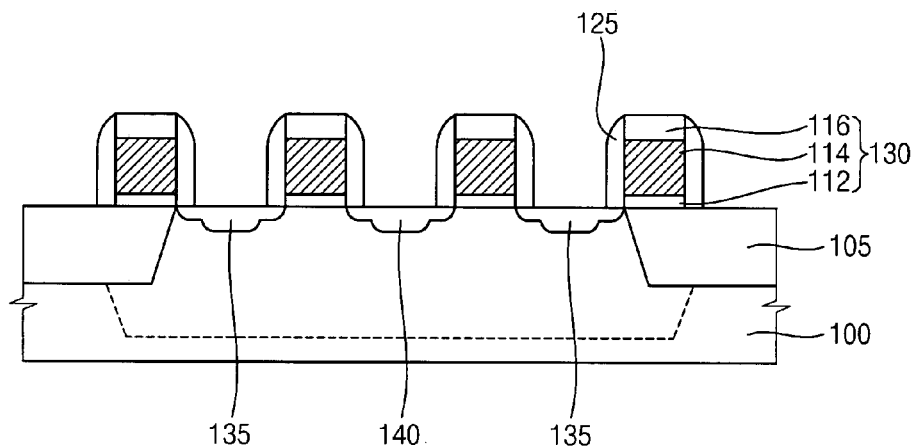

Referring to FIG. 5, a nitride layer (not illustrated) may be formed on the substrate 100 to cover the gate structure 130. The nitride layer may be partially etched by an anisotropic etching process to form a gate spacer 125 on a sidewall of the gate structure 130. The gate spacer 125 may include silicon nitride. Impurities may be implanted into the preliminary source/drain regions to form a source region 135 and a drain region 140. Each of the source and the drain regions 135 and 140 may have a lightly doped drain (LDD) structure.

In example embodiments, the source region 135 may correspond to a capacitor contact region to which a lower electrode of a capacitor is electrically connected through a first pad formed on the source region 135. The drain region 140 may correspond to a bit line contact region to which a bit line is electrically connected through a second pad formed on the drain region 140. Transistors may be formed on the substrate 100. Each of the transistors may include the gate structure 130, the gate spacer 125, the source region 135 and the drain region 140.

Figure 6:
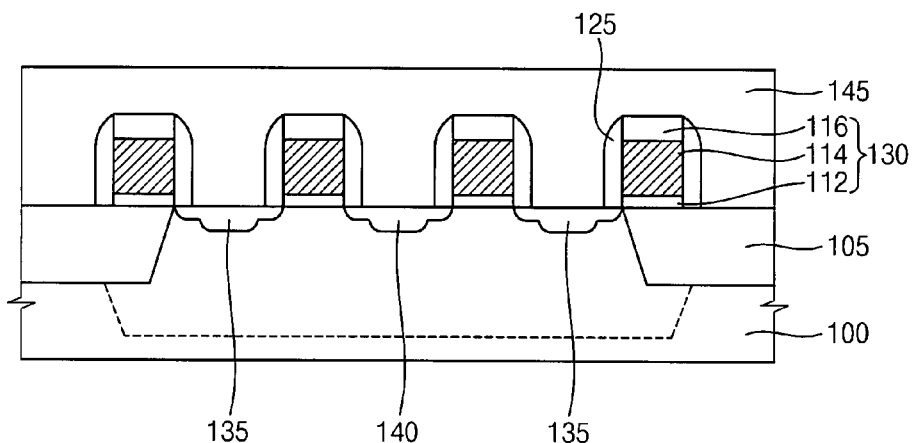

Referring to FIG. 6, the insulating interlayer 145 may be formed on the substrate 100 to cover the gate structure 130. The insulating interlayer 145 may be formed using an oxide, e.g., borophosphosilicate glass (BPSG), phosphosilicate glass (PSG), spin-on glass (SOG), plasma-enhanced tetraethylorthosilicate (PE-TEOS), undoped silicate glass (USG) and/or high-density plasma chemical vapor deposition (HDP-CVD) oxide. The insulating interlayer 145 may be formed by a chemical vapor deposition (CVD) process, a plasma-enhanced CVD (PECVD) process, an HDP-CVD process and/or an atomic layer deposition (ALD) process.

According to example embodiments, a semiconductor device, e.g., a transistor, may be formed on a substrate without performing a plasma ashing process and an ozone cleaning process for removing a photoresist pattern. Therefore, elements of the semiconductor device, e.g., a metal layer pattern, a metal compound layer pattern and a polysilicon layer pattern, may not be damaged while removing a photoresist pattern, thereby improving the electrical characteristics and reliability of the semiconductor device.

Photoresist removal efficiency was measured when photoresist was removed using supercritical carbon dioxide and a cleaning solution. To evaluate the photoresist removal efficiency, photoresist films for an ArF laser were formed on silicon substrates. Each of the photoresist films had a thickness of about 800 Å. The photoresist films were exposed to arsenic (As$^+$) ions in an ion implantation process performed with a dose of about $1\times10^{11}$ atoms/cm$^2$ to about $1\times10^{17}$ atoms/cm$^2$.

Example 1

Figure 7:
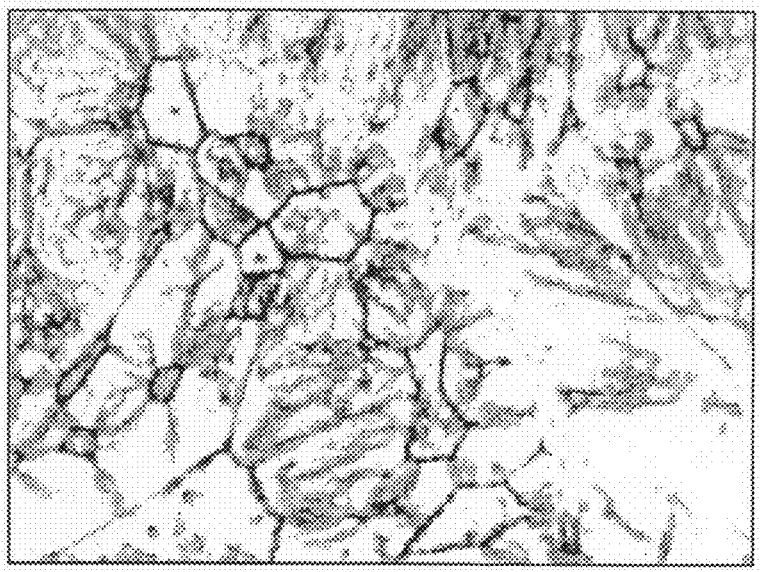

The substrate having the photoresist film exposed to the arsenic ions was loaded on a plate of a chamber. The photoresist film was treated by providing supercritical carbon dioxide onto the photoresist film for about 5 minutes at a temperature of about 90° C. and a pressure of about 2,175 psi. FIG. 7 is an image showing the treated photoresist film using the supercritical carbon dioxide obtained using an SEM.

As illustrated in FIG. 7, when the photoresist film was treated using the supercritical carbon dioxide, the photoresist film exposed to the ion implantation process had numerous cracks. Although the photoresist film was not dissolved by the supercritical carbon dioxide, the photoresist film expanded and the cracks were generated on the photoresist film because of the increased permeability of the supercritical carbon dioxide.

Example 2

Figure 8:
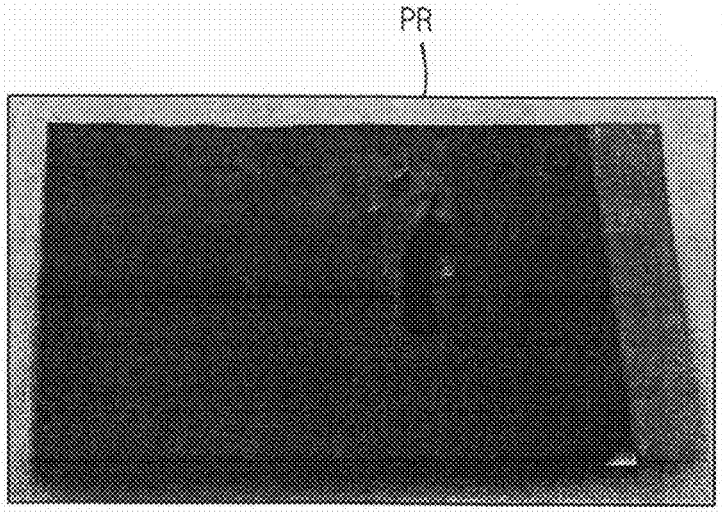

A photoresist film was treated by a process substantially the same as that of Example 1, and then the treated photoresist film was removed from the substrate by providing a cleaning solution onto the photoresist film for about 5 minutes. The cleaning solution included about 10 percent by weight of an alkanolamine solution, about 35 percent by weight of a dimethylacetamide solution, about 1 percent by weight of a reducing agent with the remainder being water. The substrate was rinsed using pure water and dried IPA. FIG. 8 is an image showing the substrate from which the photoresist film is effectively removed according to Example 2.

As illustrated in FIG. 8, more than 90 percent of the photoresist film was removed from the substrate. The photoresist film was effectively removed from the substrate using the supercritical carbon dioxide and the cleaning solution.

Comparative Example

Figure 9:
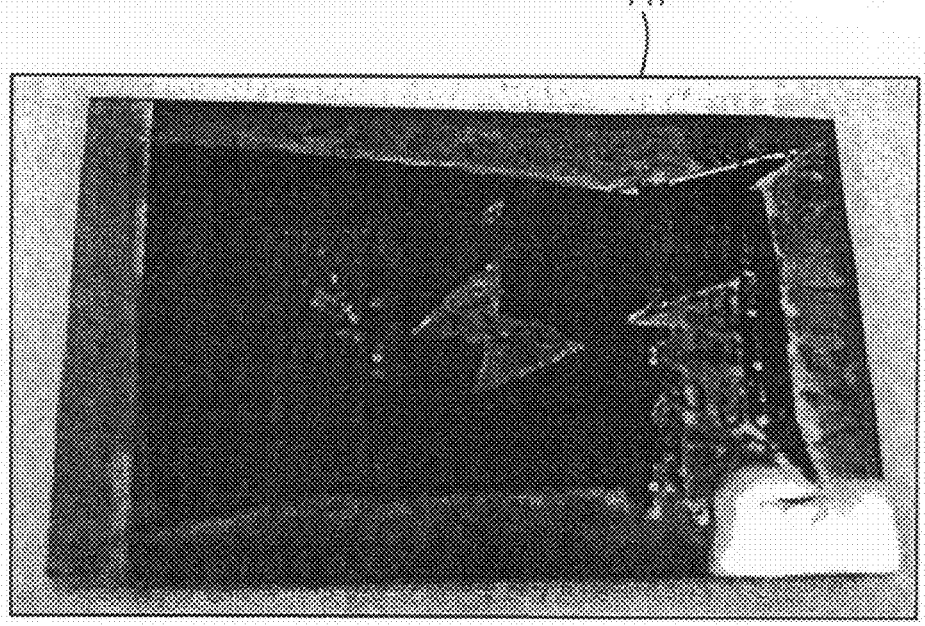

A photoresist film exposed to an ion implantation process was removed from the substrate by providing a cleaning solution onto the substrate for about 5 minutes. The cleaning solution included about 10 percent by weight of an alkanolamine solution, about 35 percent by weight of a dimethylacetamide solution, about 1 percent by weight of a reducing agent with the remainder being water. The substrate was rinsed using pure water and dried using IPA. FIG. 9 is an image showing the substrate from which the photoresist film is removed according to the Comparative Example.

Referring to FIG. 9, less than about 60 percent of the photoresist film was removed from the substrate. Accordingly, the photoresist film was not effectively removed using the cleaning solution only. A photoresist film exposed to an ion implantation process may be effectively removed from a substrate when the photoresist film is removed using supercritical carbon dioxide and a cleaning solution having a proper composition.

According to example embodiments, a photoresist pattern or a photoresist film exposed to an ion implantation process may be effectively removed from a substrate because the photoresist pattern or the photoresist film may be removed using supercritical carbon dioxide and a cleaning solution having a properly adjusted composition. For example, the supercritical carbon dioxide may be permeated into the photoresist pattern or the photoresist film, and then the cleaning solution may be applied to the photoresist pattern or the photoresist film, thereby effectively removing the photoresist pattern or the photoresist film without damage to a conductive structure formed on the substrate. When a semiconductor device is manufactured using the process for removing the photoresist pattern or the photoresist film, the semiconductor device may have enhanced electrical characteristics and reliability. Additionally, any harmful cleaning solution, e.g., a sulfuric acid solution, may not need to be employed in a process for removing the photoresist pattern or the photoresist film, and also any plasma ashing process may not need to be applied to remove the photoresist pattern or the photoresist film.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of removing photoresist comprising:
   permeating supercritical carbon dioxide into the photoresist on a substrate, the substrate having a conductive structure including a metal;
   removing the supercritical carbon dioxide not permeated into the photoresist from the substrate; and
   removing the photoresist from the substrate using a cleaning solution without damage to the conductive structure wherein the cleaning solution comprises about 8 to about 20 percent by weight of an alkanolamine solution, about 25 to about 40 percent by weight of a polar organic solution, about 0.5 to about 3 percent by weight of a reducing agent with the remainder being water.

2. The method of claim 1, wherein the photoresist comprises a photoresist pattern serving as an ion implantation mask, a photoresist pattern serving as an etching mask or photoresist residue on the substrate.

3. The method of claim 1, wherein the photoresist includes an external portion deteriorated by ions in an ion implantation process.

4. The method of claim 1, wherein the photoresist is exposed to an ion implantation process performed with a dose of about $1\times10^{11}$ atoms/cm$^2$ to about $1\times10^{17}$ atoms/cm$^2$.

5. The method of claim 1, wherein the supercritical carbon dioxide is permeated into the photoresist without a mixed solvent including an alcoholic solvent and an amino solvent.

6. The method of claim 5, wherein the supercritical carbon dioxide is permeated at a temperature of about 40° C. to about 100° C. and a pressure of about 1,000 psi to about 3,500 psi.

7. The method of claim 1, wherein the supercritical carbon dioxide is permeated into the photoresist with a mixed solvent including an alcoholic solvent and an amino solvent.

8. The method of claim 7, wherein an amount of the mixed solvent is in a range of about 0.1 to about 10 percent by weight of an amount of the supercritical carbon dioxide.

9. A method of manufacturing a semiconductor device, comprising:
   providing a substrate having a photoresist exposed to an ion implantation process, and a conductive structure including a metal;
   permeating supercritical carbon dioxide into the photoresist to expand the photoresist and to break polymer bonds in the photoresist; and
   removing the photoresist from the substrate using a cleaning solution including about 8 to about 20 percent by weight of an alkanolamine solution, about 25 to about 40 percent by weight of a polar organic solution, about 0.5 to about 3 percent by weight of a reducing agent with the remainder being water.

10. The method of claim 9, further comprising:
    implanting impurities into portions of the substrate adjacent to the conductive structure with a dose of about $1\times10^{11}$ atoms/cm$^2$ to about $1\times10^{17}$ atoms/cm$^2$ before providing the substrate.

11. The method of claim 9, wherein the photoresist includes an external portion deteriorated by ions in the ion implantation process.

12. The method of claim 9, wherein the conductive structure comprises a gate structure including a tungsten film pattern and a polysilicon film pattern.

13. The method of claim 9, wherein the photoresist comprises a photoresist pattern serving as an ion implantation mask, a photoresist pattern serving as an etching mask or photoresist residue on the substrate.

14. The method of claim 9, wherein the supercritical carbon dioxide is permeated into the photoresist without a mixed solvent including an alcoholic solvent and an amino solvent.

15. The method of claim 14, wherein the supercritical carbon dioxide is permeated at a temperature of about 40° C. to about 100° C. and a pressure of about 1,000 psi to about 3,500 psi.

16. The method of claim 9, wherein the supercritical carbon dioxide is permeated into the photoresist with a mixed solvent including an alcoholic solvent and an amino solvent.

17. The method of claim 16, wherein an amount of the mixed solvent is in a range of about 0.1 to about 10 percent by weight of an amount of the supercritical carbon dioxide.

18. The method of claim 1, wherein only the supercritical carbon dioxide permeates the photoresist.

19. The method of claim 1, wherein the cleaning solution does not include the supercritical carbon dioxide.

* * * * *